(12) United States Patent
Yoon et al.

(10) Patent No.: US 8,975,630 B2
(45) Date of Patent: Mar. 10, 2015

(54) ORGANIC LIGHT EMITTING DIODES DISPLAY

(71) Applicant: Samsung Display Co., Ltd., Yongin, Gyeonggi-Do (KR)

(72) Inventors: Ju-Won Yoon, Hwaseong-si (KR); Su-Yeon Sim, Seoul (KR); Seung Min Lee, Jeju-si (KR); Il Jeong Lee, Seoul (KR); Jeong Ho Lee, Seoul (KR); Choong Youl Im, Yongin-si (KR); Jin Sung An, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/103,434

(22) Filed: Dec. 11, 2013

(65) Prior Publication Data

US 2015/0008395 A1 Jan. 8, 2015

(30) Foreign Application Priority Data

Jul. 8, 2013 (KR) .......................... 10-2013-0079535

(51) Int. Cl.

| | |
|---|---|
| *H01L 29/04* | (2006.01) |
| *H01L 31/036* | (2006.01) |
| *H01L 31/0376* | (2006.01) |
| *H01L 31/20* | (2006.01) |
| *H01L 27/32* | (2006.01) |

(52) U.S. Cl.
CPC .................................. *H01L 27/3244* (2013.01)

USPC 257/59; 257/40; 257/E29.117; 257/E29.273; 257/E39.007

(58) Field of Classification Search
CPC .......................... H01L 27/1214; H01L 29/4908
USPC ................ 257/40, 59, 72, E39.007, E29.117, 257/E29.273
See application file for complete search history.

(56) References Cited

U.S. PATENT DOCUMENTS 7,507,998 B2 * 3/2009 Tseng .............................. 257/72

FOREIGN PATENT DOCUMENTS

| KR | 1020050122894 A | 12/2005 |
|---|---|---|
| KR | 100873705 B1 | 12/2008 |
| KR | 1020140014693 A | 2/2014 |

* cited by examiner

*Primary Examiner* — Hoai V Pham
(74) *Attorney, Agent, or Firm* — Innovation Counsel LLP

(57) ABSTRACT

An organic light emitting diodes display includes: a switching thin film transistor and a driving thin film transistor connected to the switching thin film transistor, wherein the driving thin film transistor includes a driving semiconductor layer section, a first gate insulating layer covering the driving semiconductor layer section, a floating gate electrode disposed on the first gate insulating layer, a second gate insulating layer covering the floating gate electrode, and a driving gate electrode disposed on the second gate insulating layer and at a position corresponding to the floating gate electrode, wherein the second gate insulating layer has a permittivity in the range of about 10 to about 100.

15 Claims, 7 Drawing Sheets

ORGANIC LIGHT EMITTING DIODES DISPLAY

CROSS-REFERENCE TO RELATED APPLICATION

This application claims priority to and the benefit of Korean Patent Application No. 10-2013-0079535 filed in the Korean Intellectual Property Office on Jul. 8, 2013, the entire contents of which application are incorporated herein by reference.

BACKGROUND (a) Technical Field

The present disclosure of invention relates to an organic light emitting diodes display.

(b) Description of Related Technology

A typical organic light emitting diodes display comprises light emitting elements each including two electrodes and an organic emitting layer positioned therebetween. Electrons injected from one of the electrode and holes injected from the other electrode combine with one another in the organic emitting layer to form an exciton, and light is emitted when the exciton discharges energy (e.g., in the form of photons).

The organic light emitting diodes display (OLEDD) includes a plurality of pixels each including one or more organic light emitting diodes that are each a self-light emitting element. The OLEDD typically further includes a plurality of thin film transistors (TFT's) for driving the one or more organic light emitting diodes are formed in each pixel and at least one capacitor for storing a drive level voltage. The plurality of thin film transistors typically includes a switching (OLED-addressing) thin film transistor and an OLED driving thin film transistor.

The switching thin film transistor includes a respective gate insulating layer having a relatively small thickness for the space between a gate electrode and a semiconductor layer for thereby providing a rapid switching operation. On the other hand, the OLED driving thin film transistor has a respective and relatively thicker gate insulating layer that broadens the interval between its driving gate electrode and corresponding driving semiconductor layer in order to be able to handle a broader driving range of gate voltages applied to the gate electrode of the driving thin film transistor.

In one class of embodiments, two gate insulating layers are positioned between the driving gate electrode and the driving semiconductor layer of the OLED driving thin film transistor. A problem with this configuration is that current scattering (mass production current deviation) of the driving thin film transistor may occur due to capacitance scattering associated with the two gate insulating layers.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

The present teachings show how to provide an organic light emitting diodes display that is capable of reducing current scattering (mass production current deviation) of an OLED driving thin film transistor.

An exemplary embodiment provides an organic light emitting diodes display including: a substrate, a scan line disposed on the substrate and transferring a scan signal, a data line and a driving voltage line crossing the scan line and transferring a data signal and a driving voltage, respectively, a switching thin film transistor connected to the scan line and the data line, a driving thin film transistor connected to the switching thin film transistor and the driving voltage line, and an organic light emitting diode (OLED) connected to the driving thin film transistor, in which the driving thin film transistor includes a driving semiconductor layer including a driving channel region, and a driving source region and a driving drain region disposed on both lateral surfaces of the driving channel region, a first gate insulating layer covering the driving semiconductor layer, a floating gate electrode disposed on the first gate insulating layer and disposed at a position corresponding to the driving channel region, a second gate insulating layer covering the first gate insulating layer and the floating gate electrode, and a driving gate electrode disposed on the second gate insulating layer and disposed at a position corresponding to the floating gate electrode, and permittivity of the second gate insulating layer is about 10 to about 100.

A thickness of the second gate insulating layer may be 100 Å to 1000 Å.

The second gate insulating layer may have a single-layered structure formed of any one of zirconium oxide, zirconium oxide doped with metal, hafnium oxide, hafnium oxide doped with metal, titanium oxide, titanium oxide doped with metal, aluminum oxide, and aluminum oxide doped with metal.

The second gate insulating layer may have a multilayered structure, and each layer may be formed of any one of zirconium oxide, zirconium oxide doped with metal, hafnium oxide, hafnium oxide doped with metal, titanium oxide, titanium oxide doped with metal, aluminum oxide, and aluminum oxide doped with metal.

The second gate insulating layer may have a multilayered structure including a layer formed of any one of zirconium oxide, zirconium oxide doped with metal, hafnium oxide, hafnium oxide doped with metal, titanium oxide, titanium oxide doped with metal, aluminum oxide, and aluminum oxide doped with metal, and a layer formed of a silicon oxide layer or a silicon nitride layer.

The switching thin film transistor may include a switching semiconductor layer including a switching channel region, and a switching source region and a switching drain region disposed on both lateral surfaces of the switching channel region, and a switching gate electrode disposed on the first gate insulating layer covering the switching semiconductor layer and disposed at a position corresponding to the switching channel region.

Impurity doping concentrations of the switching source region, the switching drain region, the driving source region, and the driving drain region may be substantially the same as each other.

The floating gate electrode may be disposed on the same layer as the switching gate electrode and the scan line.

The switching gate electrode may be connected to the scan line, and the floating gate electrode may be separated from the scan line.

The second gate insulating layer may cover the switching gate electrode.

The organic light emitting diodes display according to the exemplary embodiment may further include a storage capacitor connected to the driving thin film transistor and the driving voltage line.

The organic light emitting diodes display according to the exemplary embodiment may further include a first light emitting control thin film transistor and a second light emitting control thin film transistor connected to the driving thin film transistor, and a light emitting control line transferring a light emitting control signal to the first light emitting control thin film transistor and the second light emitting control thin film transistor, in which the driving thin film transistor may be connected to the driving voltage line and the organic light emitting diode through the first light emitting control thin film transistor and the second light emitting control thin film transistor.

The organic light emitting diodes display according to the exemplary embodiment may further include a compensation thin film transistor connected to the scan line and the driving thin film transistor.

The organic light emitting diodes display according to the exemplary embodiment may further include an initialization thin film transistor connected to the compensation thin film transistor, a prior scan signal line connected to the initialization thin film transistor and transferring a prior scan signal, and an initialization voltage line connected to the initialization thin film transistor and transferring an initialization voltage.

The organic light emitting diodes display according to the exemplary embodiment may further include a boosting capacitor connected to the scan line and the driving thin film transistor.

According to the exemplary embodiments of the present disclosure, it is possible to reduce an occurrence of current scattering (deviation) of a driving thin film transistor by forming a second gate insulating layer using a material having a permittivity higher than that of stoichiometric silicon nitride ($Si_3N_4$).

DETAILED DESCRIPTION

Figure 1:
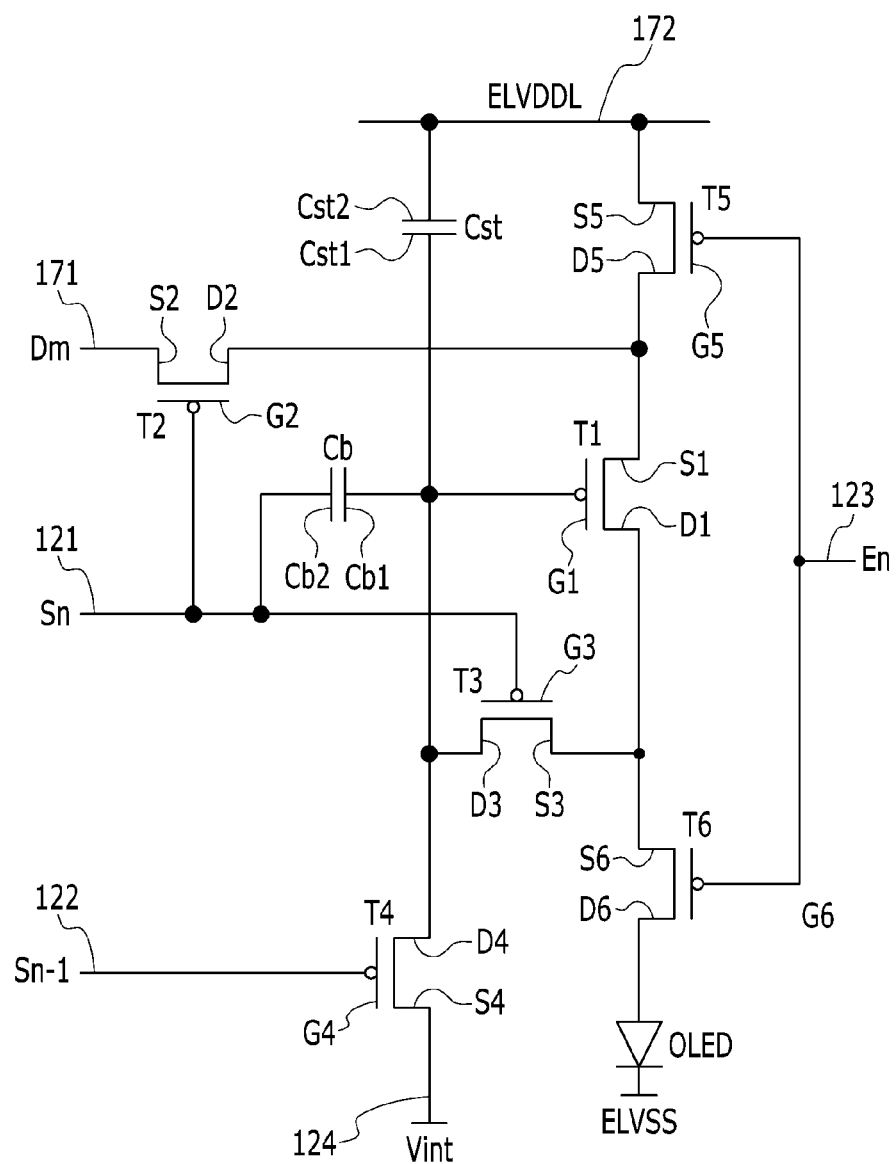
FIG. 1 is an equivalent circuit diagram of one pixel of an organic light emitting diodes display according to an exemplary embodiment of the present disclosure of invention.

In the following detailed description, only certain exemplary embodiments of in accordance with the present teachings have been shown and described, simply by way of illustration. As those skilled in the art would realize in light of the present disclosure, the described embodiments may be modified in various different ways, all without departing from the spirit or scope of the present teachings.

Accordingly, the drawings and description are to be regarded as illustrative in nature and not restrictive. Like reference numerals designate like elements throughout the specification.

In addition, the size and thickness of each configuration shown in the drawings are arbitrarily shown for understanding and ease of description, but the present disclosure is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. Further, in the specification, the word "~on" means positioning on or below the object portion, but does not essentially mean positioning on the upper side of the object portion based on a gravity direction.

In addition, an active matrix (AM) type organic light emitting diodes display having a 6Tr 2Cap structure is illustrated where six thin film transistors (TFT's, the 6Tr) and two capacitors (the 2Cap's) are provided in each one pixel as shown the accompanying drawings. However, the present disclosure of invention is not limited thereto. Accordingly, in the organic light emitting diodes display, a plurality of thin film transistors and one or more capacitors may be provided in one pixel, and a separate wire may be further formed or a known wire may be omitted from being so formed in the organic light emitting diode display having various structures. Here, a pixel refers to a minimum picture forming element or cell unit (without consideration for its respective color) for displaying an image. Here, the organic light emitting diodes display displays the image through selective actuation of a plurality of such elemental pixels where some may have different colors than others (e.g., R, G, B, W).

An organic light emitting diodes display according to an exemplary embodiment of the present disclosure will be described in detail with reference to FIGS. 1 to 5.

FIG. 1 is an equivalent circuit diagram of one pixel of the organic light emitting diode display according to the exemplary embodiment.

As illustrated in FIG. 1, one pixel of the organic light emitting diodes display according to the present exemplary embodiment includes a plurality of signal lines 121, 122, 123, 124, 171, and 172, a plurality of thin film transistors T1, T2, T3, T4, T5, and T6 connected to the plurality of signal lines. The pixel unit also includes capacitors Cst and Cb, and an organic light emitting diode (OLED).

Among the thin film transistors there is provided an OLED driving thin film transistor T1, a switching thin film transistor T2, a compensation thin film transistor T3, an initialization thin film transistor T4, a first light emitting control (enabling) thin film transistor T5, and a second light emitting control (enabling) thin film transistor T6. The capacitors include a storage capacitor Cst and a boosting capacitor Cb.

The signal lines include a scan line 121 transferring a current-row scan signal Sn, a prior scan line 122 transferring a prior scan signal Sn−1 to the initialization thin film transistor T4, a light emitting control (enabling) line 123 transferring a light emitting control signal En to the first light emitting control thin film transistor T5 and to the second light emitting control thin film transistor T6, a data line 171 transferring a data signal Dm, a driving voltage line 172 transferring a driving voltage ELVDD and formed substantially in parallel to the data line 171, and an initialization voltage line 124 transferring an initialization voltage Vint for initializing a state of the driving thin film transistor T1.

As shown in FIG. 1, a gate electrode G1 of the driving thin film transistor T1 is connected to one end (one plate) Cst1 of the storage capacitor Cst, a source electrode S1 of the driving thin film transistor T1 is connected via the first light emitting control thin film transistor T5 to the driving voltage line 172, and a drain electrode D1 of the driving thin film transistor T1 is electrically connected via the second light emitting control thin film transistor T6 to an anode of the organic light emitting diode (OLED). The driving thin film transistor T1 receives the data signal Dm from the data line 171 when the switching thin film transistor T2 is turned on and depending the data signal Dm, the driving TFT T1 later responds accordingly to supply a driving current to the organic light emitting diode (OLED).

A gate electrode G2 of the switching thin film transistor T2 is connected to the current-row scan line 121, a source electrode S2 of the switching thin film transistor T2 is connected to the data line 171, a drain electrode D2 of the switching thin film transistor T2 is connected via the first light emitting control thin film transistor T5 to the driving voltage line 172 while being connected to the source electrode S1 of the driving thin film transistor T1. The switching thin film transistor T2 is turned on according to the scan signal Sn transferred through the scan line 121 to perform the switching operation transferring the data signal Dm transferred to the data line 171 to the source electrode of the driving thin film transistor T1.

A gate electrode G3 of the compensation thin film transistor T3 is connected to the scan line 121, a source electrode S3 of the compensation thin film transistor T3 is connected to the drain electrode D1 of the driving thin film transistor T1 and the anode of the organic light emitting diode (OLED), and a drain electrode D3 of the compensation thin film transistor T3 is connected to one end Cb1 of the boosting capacitor Cb and a drain electrode D4 of the initialization thin film transistor T4. The compensation thin film transistor T3 is turned on according to the scan signal Sn transferred through the scan line 121 to connect the gate electrode G1 and the drain electrode D1 of the driving thin film transistor T1 to each other, thus causing diode-connection operation by the driving thin film transistor T1 when T3 turns on. Therefore, the driving current flows through the diode-connected driving thin film transistor T1 when Sn is active (e.g., pulled low).

A gate electrode G4 of the initialization thin film transistor T4 is connected to the prior scan line 122, a source electrode S4 of the initialization thin film transistor T4 is connected to the initialization voltage line 124, and a drain electrode D4 of the initialization thin film transistor T4 is connected to one end Cb1 of the boosting capacitor, one end Cst1 of the storage capacitor, the drain electrode D3 of the compensation thin film transistor T3, and the gate electrode G1 of the driving thin film transistor T1. The initialization thin film transistor T4 is turned on according to the prior scan signal Sn−1 transferred through the prior scan line 122 to transfer the initialization voltage Vint to the gate electrode G1 of the driving thin film transistor T1, thus performing an initialization operation initializing the voltage of the gate electrode G1 of the driving thin film transistor T1 and initializing the voltage of the storage capacitor Cst.

A gate electrode G5 of the first light emitting control thin film transistor T5 is connected to the light emitting control line 123, a source electrode S5 of the first light emitting control thin film transistor T5 is connected to the driving voltage line 172, and a drain electrode D5 of the first light emitting control thin film transistor T5 is connected to the source electrode S1 of the driving thin film transistor T1 and the drain electrode S2 of the switching thin film transistor T2.

A gate electrode G6 of the second light emitting control thin film transistor T6 is connected to the light emitting control line 123, a source electrode S6 of the second light emitting control thin film transistor T6 is connected to the drain electrode D5 of the first light emitting control thin film transistor T5, and a drain electrode D6 of the second light emitting control thin film transistor T6 is electrically connected to the anode of the organic light emitting diode (OLED). The first light emitting control thin film transistor T5 and the second light emitting control thin film transistor T6 are turned on according to a light emitting control signal En transferred through the light emitting control line 123 to transfer the driving voltage ELVDD to the organic light emitting diode (OLED), thus allowing the driving current to flow through the organic light emitting diode (OLED).

The scan line 121 connected to the gate electrode G2 of the switching thin film transistor T2 is connected to the other end Cb2 of the boosting capacitor Cb, and one end Cb1 of the boosting capacitor Cb is connected to the gate electrode G1 of the driving thin film transistor T1.

The other end Cst2 of the storage capacitor Cst is connected to the driving voltage line 172, and a cathode of the organic light emitting diode (OLED) is connected to a common voltage ELVSS. Accordingly, the organic light emitting diode (OLED) receives a driving current Id from the driving thin film transistor T1 to emit light, thereby displaying an image.

Hereinafter, a specific operation process of one pixel of the organic light emitting diode display according to the exemplary embodiment of the present disclosure will be described in detail.

First, the prior scan signal Sn−1 at a low level (an active level for the PMOS transistors shown here) is supplied through the prior scan line 122 during an initialization period. Then, the initialization thin film transistor T4 is turned on in response to the prior scan signal Sn−1 at the low level, and the initialization voltage Vint is supplied from the initialization voltage line 124 through the initialization thin film transistor T4 to the driving thin film transistor T1 and storage capacitor Cst to initialize the driving thin film transistor T1.

Subsequently, Sn−1 goes high and then the scan signal Sn at the active low level is supplied through the scan line 121 during a data programming period. Then, the switching thin film transistor T2 and the compensation thin film transistor T3 are turned on in response to the scan signal Sn at the low level.

In this case, the driving thin film transistor T1 is turned on in a diode-connection form by action of the compensation thin film transistor T3, and particularly, since the driving thin film transistor T1 is initialized during the aforementioned initialization period, the driving thin film transistor T1 is diode-connected in a forward direction. Therefore, the data signal Dm supplied from the data line 171 flows by way of the turned-on switching thin film transistor T2, the turned-on driving thin film transistor T1, and the turned-on compensation thin film transistor T3, such that a voltage corresponding to a difference between the data signal Dm and a threshold voltage Vth of the driving thin film transistor T1 is stored in the storage capacitor Cst during this phase of the operations.

Subsequently, if supplying of the active-low scan signal Sn is stopped and the level of the voltage of the scan signal Sn is changed into a high level, the voltage applied to the gate electrode G1 of the driving thin film transistor T1 is changed corresponding to a difference of the voltage of the scan signal Sn by a coupling action of the boosting capacitor Cb. In this case, since the voltage applied to the gate electrode G1 of the driving thin film transistor T1 is changed by charge sharing between the storage capacitor Cst and the boosting capacitor Cb, a change amount of the voltage applied to the driving gate electrode G1 varies in proportion to a difference of the voltage of the scan signal Sn and a charge sharing value between the storage capacitor Cst and the boosting capacitor Cb.

Subsequently, the light emitting control signal En supplied from the light emitting control line 123 during a light emitting period is changed from the high level to the active-low level. Then, the first light emitting control thin film transistor T5 and the second light emitting control thin film transistor T6 are turned on by the light emitting control signal En at the low level during the light emitting period. Thereby, the driving voltage ELVDD goes through the driving voltage line 172 via the first light emitting control thin film transistor T5, the driving thin film transistor T1, the second light emitting control thin film transistor T6, and the organic light emitting diode (OLED) to allow the driving current to flow through a path to the common voltage ELVSS.

The driving current is controlled by the driving thin film transistor T1, and the driving thin film transistor T1 generates the driving current having the magnitude corresponding to the voltage supplied to the gate electrode G1 thereof. In this case, since the voltage reflecting the threshold voltage of the driving thin film transistor T1 is stored in the storage capacitor Cst during the aforementioned data programming period, the threshold voltage of the driving thin film transistor T1 is compensated for during the light emitting period.

Next, a detailed structure of the pixel of the organic light emitting diodes display illustrated in FIG. 1 will be described in detail with reference to FIGS. 2 to 5 together with FIG. 1.

Figure 2:
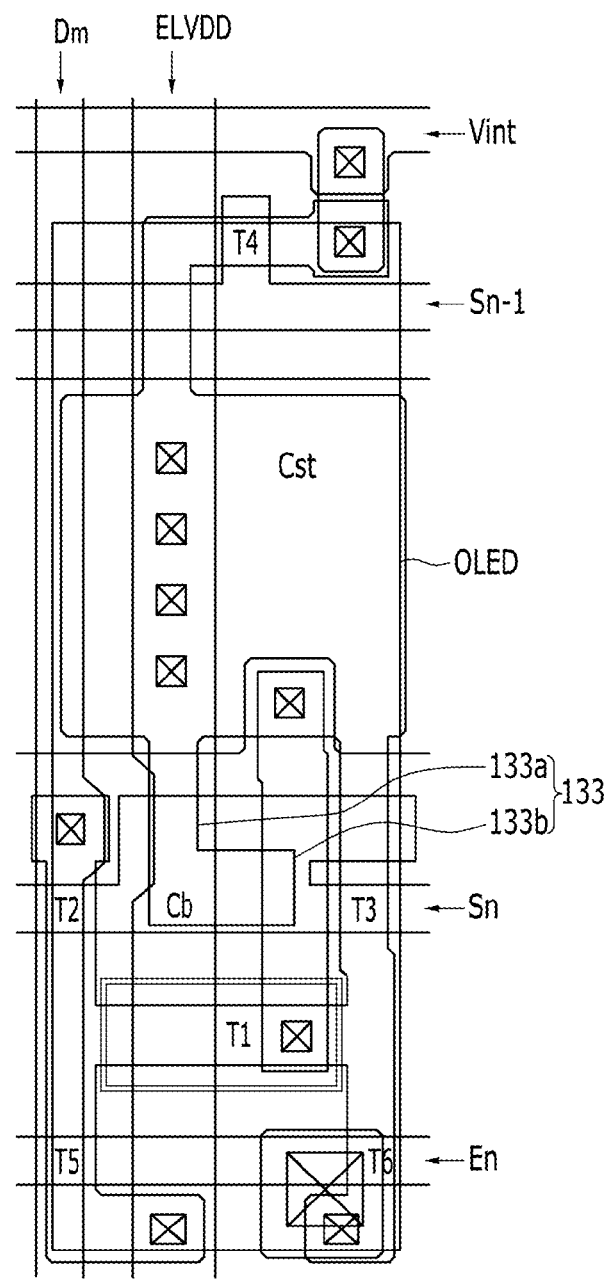
FIG. 2 is a view schematically illustrating positions of a plurality of thin film transistors and capacitors in one pixel of the organic light emitting diode display according to the exemplary embodiment of FIG. 1.
Figure 3:
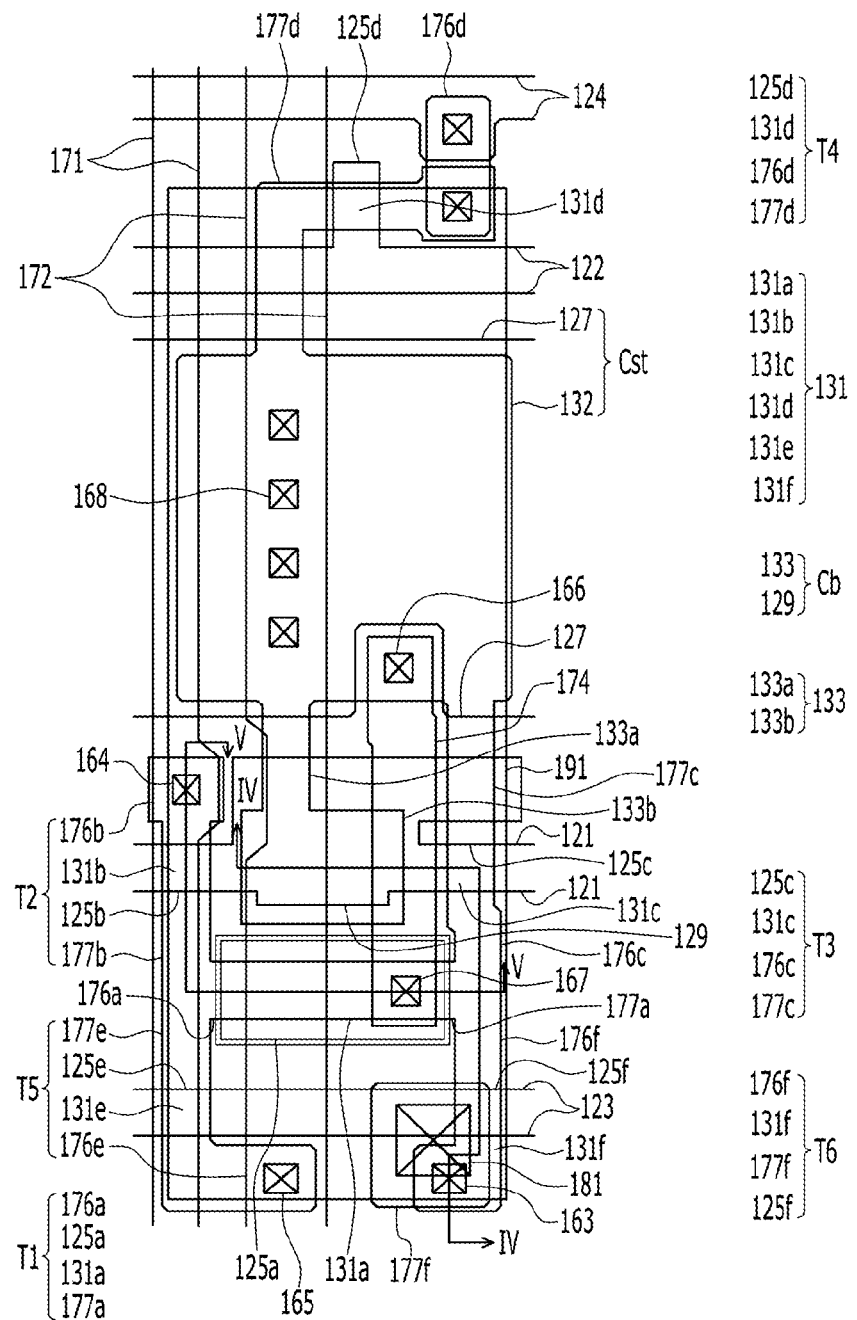
FIG. 3 is a specific layout view of one pixel of the organic light emitting diode display according to the exemplary embodiment of FIG. 1.
Figure 4:
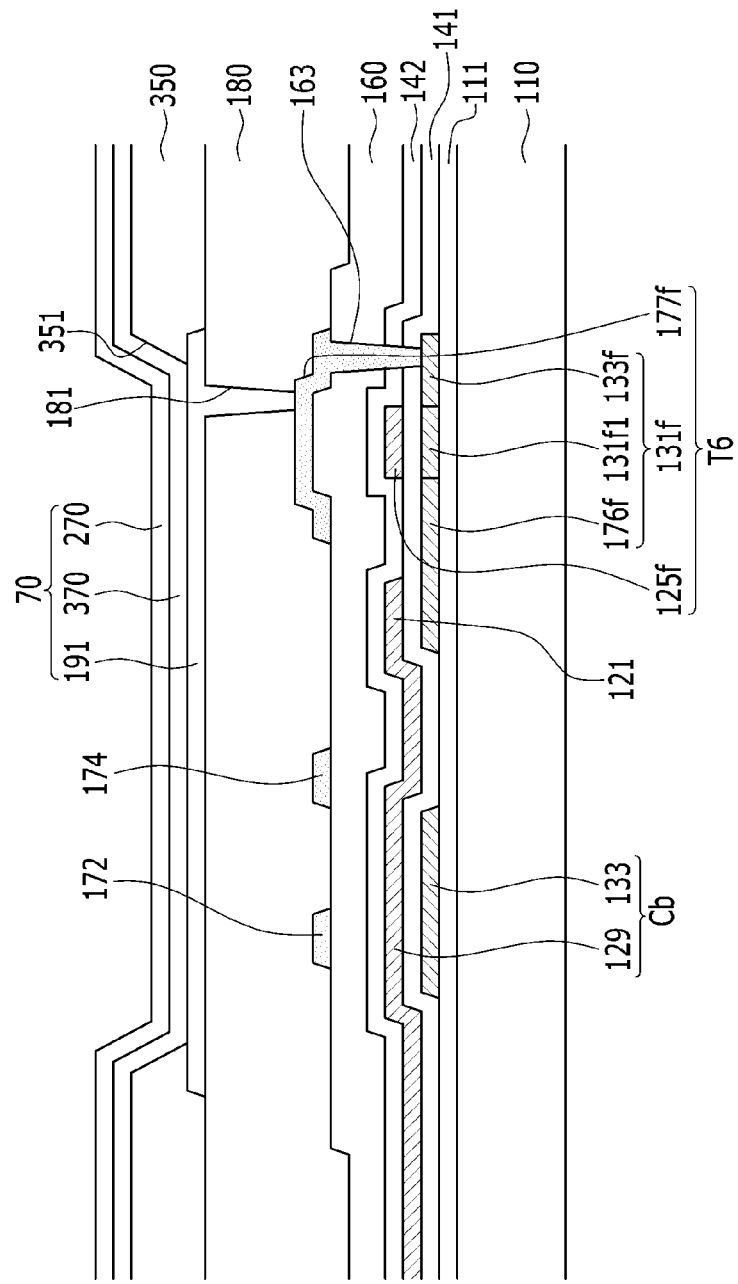
FIG. 4 is a cross-sectional view of the organic light emitting diode display of FIG. 3, which is taken along line IV-IV.
Figure 5:
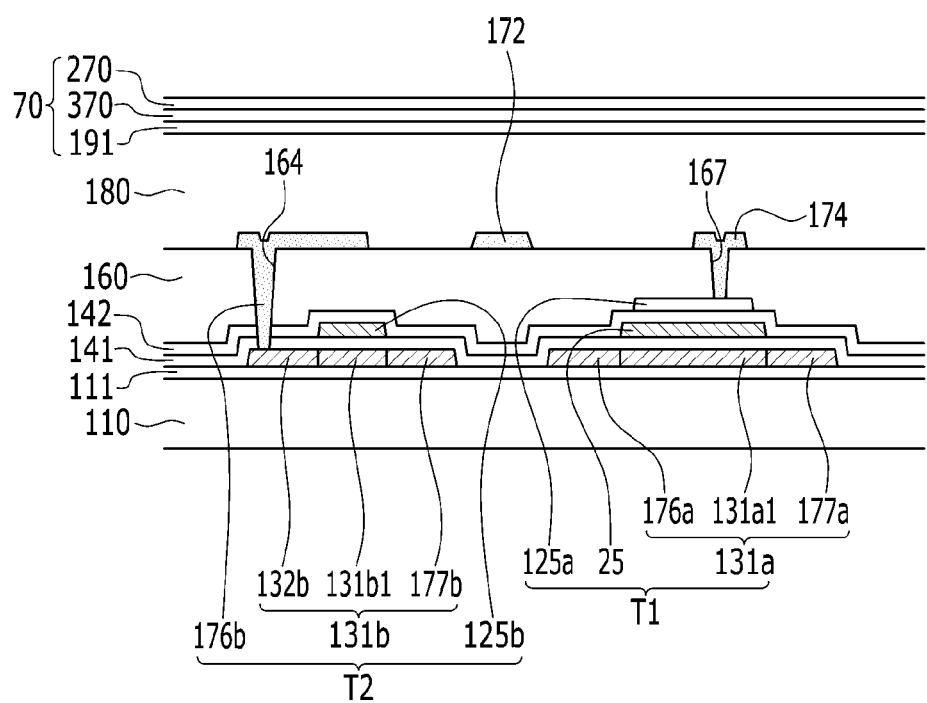
FIG. 5 is a cross-sectional view of the organic light emitting diode display of FIG. 3, which is taken along line V-V.

FIG. 2 is a view schematically illustrating positions of a plurality of thin film transistors and capacitors in one pixel of the organic light emitting diodes display according to the exemplary embodiment of FIG. 1. FIG. 3 is a specific layout view of one pixel of the organic light emitting diodes display according to the exemplary embodiment. FIG. 4 is a cross-sectional view of the organic light emitting diode display of FIG. 3, which is taken along line IV-IV. FIG. 5 is a cross-sectional view of the organic light emitting diode display of FIG. 3, which is taken along line V-V.

As illustrated in FIGS. 2 to 5, one pixel of the organic light emitting diodes display according to the present exemplary embodiment includes the scan (Sn) line 121, the prior scan (Sn−1) line 122, the light emitting control (En) line 123, and the initialization voltage line 124 respectively applying the scan signal Sn, the prior scan signal Sn−1, the light emitting control signal En, and the initialization voltage Vint, and each formed to extend in a row direction.

Further, the pixel includes the data line 171 and the driving voltage line 172 crossing all of the scan line 121, the prior scan line 122, the light emitting control line 123, and the initialization voltage line 124 and applying the data signal Dm and the driving voltage ELVDD, respectively, to the pixel.

Further, the pixel includes the driving thin film transistor T1, the switching thin film transistor T2, the compensation thin film transistor T3, the initialization thin film transistor T4, the first light emitting control thin film transistor T5, the second light emitting control thin film transistor T6, the storage capacitor Cst, the boosting capacitor Cb, and an organic light emitting diode (OLED) 70.

The driving thin film transistor T1, the switching thin film transistor T2, the compensation thin film transistor T3, the initialization thin film transistor T4, the first light emitting control thin film transistor T5, and the second light emitting control thin film transistor T6 are disposed along a semiconductor layer 131, and the semiconductor layer 131 is bent to have various shapes.

The semiconductor layer 131 is formed of polysilicon and includes a channel region not substantially doped with an impurity and a source region and a drain region doped with the impurity at both sides of the channel region. Herein, the impurity varies depending on a kind of thin film transistor, and an N type impurity or a P type impurity is feasible. FIG. 1 shows N-type transistors. The semiconductor layer includes a driving semiconductor layer section 131a formed in the driving thin film transistor T1, a switching semiconductor layer section 131b formed in the switching thin film transistor T2, a compensation semiconductor layer section 131c formed in the compensation thin film transistor T3, an initialization semiconductor layer section 131d formed in the initialization thin film transistor T4, and a first light emitting control semiconductor layer section 131e and a second light emitting control semiconductor layer section 131f formed in the first light emitting control thin film transistor T5 and the second light emitting control thin film transistor T6, respectively.

The driving thin film transistor T1 includes the driving semiconductor layer section 131a, a driving gate electrode 125a, a driving source electrode 176a, a driving drain electrode 177a, and a floating gate electrode 25. The driving source electrode 176a corresponds to a driving source region 176a doped with the impurity in the driving semiconductor layer 131a, and the driving drain electrode 177a corresponds to a driving drain region 177a doped with the impurity in the driving semiconductor layer 131a. The floating gate electrode 25 overlaps with the driving gate electrode 125a, and is disposed beneath the driving gate electrode 125a. The floating gate electrode 25 is disposed on the same layer as that of a switching gate electrode 125b, a compensation gate electrode 125c, a first light emitting control gate electrode 125e, and a second light emitting control gate electrode 125f as will be described later, and the scan line 121, the prior scan line 122, and the light emitting control line 123.

The switching thin film transistor T2 includes the switching semiconductor layer 131b, the switching gate electrode 125b, a switching source electrode 176b, and a switching drain electrode 177b. The switching drain electrode 177b corresponds to a switching drain region 177b doped with the impurity in the switching semiconductor layer 131b.

The compensation thin film transistor T3 includes the compensation semiconductor layer 131c, the compensation gate electrode 125c, a compensation source electrode 176c, and a compensation drain electrode 177c. The compensation source electrode 176c corresponds to a compensation source region doped with the impurity in the compensation semiconductor layer 131c, and the compensation drain electrode 177c corresponds to a compensation drain region doped with the impurity in the compensation semiconductor layer 131c.

The initialization thin film transistor T4 includes the initialization semiconductor layer 131d, an initialization gate electrode 125d, an initialization source electrode 176d, and an initialization drain electrode 177d. The initialization drain electrode 177d corresponds to an initialization drain region doped with the impurity in the initialization semiconductor layer 131d.

The first light emitting control thin film transistor T5 includes the first light emitting control semiconductor layer 131e, the first light emitting control gate electrode 125e, a first light emitting control source electrode 176e, and a first light emitting control drain electrode 177e. The first light emitting control drain electrode 177e corresponds to a first light emitting control drain region doped with the impurity in the first light emitting control semiconductor layer 131e.

The second light emitting control thin film transistor T6 includes the second light emitting control semiconductor layer 131f, the second light emitting control gate electrode 125f, a second light emitting control source electrode 176f, and a second light emitting control drain electrode 177f. The second light emitting control source electrode 176f corresponds to a second light emitting control source region 176f doped with the impurity in the second light emitting control semiconductor layer 131f.

The storage capacitor Cst includes a first storage capacitive plate 132 and a second storage capacitive plate 127 disposed while a first gate insulating layer 141 is interposed therebetween. Herein, the first gate insulating layer 141 is a dielectric material, and a storage capacitance is determined by charges accumulated in the storage capacitor Cst and a voltage between both capacitive plates 132 and 127.

The first storage capacitive plate 132 is disposed on the same layer as that of the driving semiconductor layer 131a, the switching semiconductor layer 131b, the compensation semiconductor layer 131c, the first light emitting control semiconductor layer 131e, and the second light emitting control semiconductor layer 131f, and the second storage capacitive plate 127 is disposed on the same layer as the scan line 121, the prior scan line 122, and the like.

The driving semiconductor layer 131a of the driving thin film transistor T1 connects to the switching semiconductor layer 131b and the compensation semiconductor layer 131c and the first light emitting control semiconductor layer 131e and the second light emitting control semiconductor layer 131f, thus connecting one to the other. Therefore, the driving source electrode 176a is connected to the switching drain electrode 177b and the first light emitting control drain electrode 177e, and the driving drain electrode 177a is connected to the compensation source electrode 176c and the second light emitting control source electrode 176f.

The first storage capacitive plate 132 of the storage capacitor Cst is connected to the compensation drain electrode 177c and the initialization drain electrode 177d, and connected through a connecting member 174 to the driving gate electrode 125a. In this case, the connecting member 174 is disposed on the same layer as the data line 171. The connecting member 174 is connected through a contact hole 167 formed in an interlayer insulating layer 160, the first gate insulating layer 141, and a second gate insulating layer 142 as will be described later to the first storage capacitive plate 132, and connected through a contact hole 166 formed in the interlayer insulating layer 160 to the driving gate electrode 125a.

The second storage capacitive plate 127 of the storage capacitor Cst is connected through a contact hole 168 formed in the interlayer insulating layer 160 to the driving voltage line 172, and disposed substantially parallel to the scan line 121.

A first boosting capacitive plate 133 of the boosting capacitor Cb is an extension portion extending from the first storage capacitive plate 132, and a second boosting capacitive plate 129 is a protrusion portion protruding upwardly and downwardly from the scan line 121.

The first boosting capacitive plate 133 has a hammer shape, and the first boosting capacitive plate 133 includes a handle portion 133a that is parallel to the driving voltage line 172 and a head portion 133b disposed at an end of the handle portion 133a.

The head portion 133b of the first boosting capacitive plate 133 is positioned in the second boosting capacitive plate 129 to overlap with the second boosting capacitive plate 129.

Therefore, an area of the first boosting capacitive plate 133 of the boosting capacitor Cb is smaller than an area of the second boosting capacitive plate 129.

Meanwhile, the switching thin film transistor T2 is used as a switching element selecting the pixel that is to be programmed by the Dm signal to emit a corresponding amount of light. The switching gate electrode 125b is connected to the scan line 121, the switching source electrode 176b is connected to the data line 171, and the switching drain electrode 177b is connected to the driving thin film transistor T1 and the first light emitting control thin film transistor T5. In addition, the second light emitting control drain electrode 177f of the second light emitting control thin film transistor T6 is directly connected through a contact hole 181 formed in a passivation layer 180 to a pixel electrode 191 of the organic light emitting diode 70.

Hereinafter, a structure of an organic light emitting diode display according to the exemplary embodiment will be more specifically described according to the lamination (stacking) order.

In this case, the structure of the thin film transistor will be described based on the driving thin film transistor T1, the switching thin film transistor T2, and the second light emitting control thin film transistor T6. In addition, since the remaining thin film transistors T3, T4, and T5 are almost the same as the lamination structure of the driving thin film transistor T1, the switching thin film transistor T2, and the second light emitting control thin film transistor T6, a detailed description thereof will be omitted.

An insulative buffer layer 111 is disposed on a substrate 110 formed of an insulating material such as glass, quartz, ceramic, and plastic.

The driving semiconductor layer 131a, the switching semiconductor layer 131b, the second light emitting control semiconductor layer 131f, and the first boosting capacitive plate 133 are disposed on the buffer layer 111.

The driving semiconductor layer 131a includes a driving channel region 131a1, and the driving source region 176a and the driving drain region 177a are facing spaced apart from each other while the driving channel region 131a1 is interposed therebetween. The switching semiconductor layer 131b includes a switching channel region 131b1, and a switching source region 132b and a switching drain region 177b facing each other while the switching channel region 131b1 is interposed therebetween. The second light emitting control semiconductor layer 131f includes a light emitting control channel region 131f1, and the light emitting control source region 176f and the light emitting control drain region 133f facing each other while the light emitting control channel region 131f1 is interposed therebetween. Herein, impurity doping concentrations of the switching source region 132b, the switching drain region 177b, the driving source region 176a, and the driving drain region 177a may be the same as each other.

The first gate insulating layer 141 formed of a silicon nitride (SiNx) or silicon oxide (SiO2) is disposed on the driving semiconductor layer 131a, the switching semiconductor layer 131b, the second light emitting control semiconductor layer 131f, and the first boosting capacitive plate 133.

The scan line 121 including the switching gate electrode 125b and the compensation gate electrode 125c, the prior scan line 122 including the initialization gate electrode 125d, the light emitting control line 123 including the first light emitting control gate electrode 125e and the second light emitting control gate electrode 125f, and a gate wire including the floating gate electrode 25 are disposed on the first gate insulating layer 141.

The floating gate electrode 25 (FIGS. 5-6) is separated from the scan line 121, and the floating gate electrode 25 overlaps with the driving channel region 131a1 of the driving semiconductor layer 131a. The switching gate electrode 125b is connected to the scan line 121, and overlaps with the switching channel region 131b1 of the switching semiconductor layer 131b. The second light emitting control gate electrode 125f overlaps with the light emitting control channel region 131f1 of the second light emitting control semiconductor layer 131f. The gate wire further includes the second storage capacitive plate 127 forming the storage capacitor Cst, and the second boosting capacitive plate 129 forming the boosting capacitor Cb.

The second gate insulating layer 142 is disposed on the gate wires 25, 125b, 125c, 125c, 125e, 125f, 121, 122, 123, 127, and 129 and the first gate insulating layer 141.

The second gate insulating layer 142 is formed of a high-K dielectric material having permittivity (dielectric constant ER) of 10 to 100, and a thickness thereof may be 100 Å to 1000 Å.

The high-K second gate insulating layer 142 may have a single-layered structure formed of any one of zirconium oxide ($ZrO_3$), zirconium oxide doped with metal, hafnium oxide ($HfO_3$), hafnium oxide doped with metal, titanium oxide ($TiO_2$), titanium oxide doped with metal, aluminum oxide (Al2O3), and aluminum oxide doped with metal.

Further, the second gate insulating layer 142 may have a multilayered structure. In this case, each layer of the second gate insulating layer 142 may be formed of any one of zirconium oxide, zirconium oxide doped with metal, hafnium oxide, hafnium oxide doped with metal, titanium oxide, titanium oxide doped with metal, aluminum oxide, and aluminum oxide doped with metal.

Further, the second gate insulating layer 142 may have a multilayered structure including a layer formed of any one of zirconium oxide, zirconium oxide doped with metal, hafnium oxide, hafnium oxide doped with metal, titanium oxide, titanium oxide doped with metal, aluminum oxide, and aluminum oxide doped with metal, and a layer formed of a silicon oxide layer or a silicon nitride layer.

The driving gate electrode 125a is disposed on the second gate insulating layer 142. The driving gate electrode 125a overlaps with the floating gate electrode 25.

In the driving thin film transistor T1, since the driving gate electrode 125a is disposed on the first gate insulating layer 141 and on the high-K second gate insulating layer 142, the physical interval between the driving gate electrode 125a and the driving semiconductor layer 131a becomes broad. Therefore, because the corresponding electric field may be spread out across a greater distance, a driving range of the gate voltages applied to the driving gate electrode 125a can be broadened, and the grayscale of light emitted from the organic light emitting diode (OLED) can be more finely controlled by changing the magnitude of the gate voltage, and as a result, it is possible to increase a resolution of the organic light emitting diodes display and improve a display quality.

In this case, in the switching thin film transistor T2, since the second gate insulating layer 142 is not there interposed but rather only the first gate insulating layer 141 is interposed between the switching gate electrode 125b and the switching semiconductor layer section 131b, a rapid switching operation is feasible for the switching thin film transistor T2.

The interlayer insulating layer 160 is disposed on the second gate insulating layer 142 and the driving gate electrode 125a. The first gate insulating layer 141 (e.g., SiNx), the high-K second gate insulating layer 142, and the interlayer insulating layer 160 have a contact hole 163 through which the second light emitting control drain region 133f of the second light emitting control semiconductor layer 131f is exposed, and a contact hole 164 through which the switching source region 132b of the switching semiconductor layer 131b is exposed together. The interlayer insulating layer 160, like the first gate insulating layer 141, is made of an inorganic material such as a silicon nitride (SiNx) or a silicon oxide (SiOx, $SiO_2$).

The data line 171 including the switching source electrode 176b, and data wires including the connecting member 174, the second light emitting control drain electrode 177f, and the driving voltage line 172 are disposed on the interlayer insulating layer 160.

The switching source electrode 176b and the second light emitting control drain electrode 177f are connected through the contact holes 164 and 163 formed in the interlayer insulating layer 160, the first gate insulating layer 141, and the second gate insulating layer 142 to the switching source region 132b of the switching semiconductor layer 131b and the second light emitting control drain region 133f of the second light emitting control semiconductor layer 131f, respectively.

The planarizing passivation layer 180 covering the data wires 171, 174, 177f, and 172 is disposed on the interlayer insulating layer 160, and the pixel electrode 191 is disposed on the passivation layer 180. The pixel electrode 191 is connected through the contact hole 181 formed in the passivation layer 180 to the second light emitting control drain electrode 177f.

A partition layer 350 is disposed on an edge of the pixel electrode 191 and the passivation layer 180, and the partition layer 350 has a partition opening 351 through which the pixel electrode 191 is exposed. The partition layer 350 may be made of resins such as a polyacrylate resin and polyimides, silica-based inorganic materials, or the like.

An organic light emitting layer 370 is disposed on the pixel electrode 191 exposed through the partition opening 351, and a common electrode 270 is disposed on the organic light emitting layer 370. The organic light emitting diode 70 including the pixel electrode 191, the organic light emitting layer 370, and the common electrode 270 is formed.

Herein, the pixel electrode 191 is an anode that is a hole injection electrode, and the common electrode 270 is a cathode that is an electron injection electrode. However, the exemplary embodiment according to the present disclosure is not necessarily limited thereto, and the pixel electrode 191 may be the cathode and the common electrode 270 may be the anode according to a driving method of the organic light emitting diode display. Holes and electrons are injected from the pixel electrode 191 and the common electrode 270 into the organic light emitting layer 370, and when an exciton formed by a combining of the injected holes and electrons falls from an excited state to a bottom state, light (photons) is/are emitted.

The organic light emitting layer 370 may be formed of a low molecular weight organic material or a high molecular weight organic material such as PEDOT (poly 3,4-ethylenedioxythiophene). Further, the organic light emitting layer 370 may be formed of multilayers including one or more of a light emitting layer, a hole injection layer (HIL), a hole transporting layer (HTL), an electron transporting layer (ETL), and an electron injection layer (EIL). In the case where all the layers are included, the hole injection layer is disposed on the pixel electrode 191 that is the anode, and the hole transporting layer, the light emitting layer, the electron transporting layer, and the electron injection layer are sequentially laminated thereon. Since the common electrode 270 is formed of a reflection type conductive material, a bottom emitting type organic light emitting diode display is obtained. Material such as lithium (Li), calcium (Ca), lithium fluoride/calcium (LiF/Ca), lithium fluoride/aluminum (LiF/Al), aluminum (Al), silver (Ag), magnesium (Mg), or gold (Au) may be used as the reflection type material.

Figure 6:
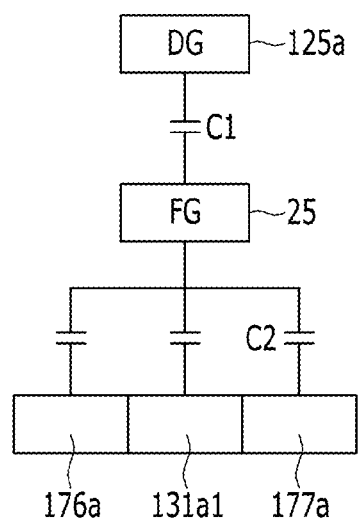
FIG. 6 is a view schematically illustrating a first floating capacitor and a second floating capacitor of a driving thin film transistor of the organic light emitting diode display according to an exemplary embodiment.

FIG. 6 is an equivalent circuit schematic illustrating the driving thin film transistor T1 as having a first floating capacitor C1 and a second floating capacitor C2 for coupling a drive voltage applied to the driver gate electrode 125a so as to affect the channel region 131a1 of the driving thin film transistor T1.

As illustrated in FIG. 6, in the driving thin film transistor T1, a first floating capacitor C1 is formed to have as its dielectric, the high-K second gate insulating layer 142 formed between the driving gate electrode 125a and the floating gate electrode 25. A second floating capacitor C2 is formed to have as its dielectric, the inorganic (e.g., SiNx or SiOy or SiNxOy) first gate insulating layer 141 formed between the floating gate electrode 25 and the channel region 131a1 of the driving thin film transistor T1. The second floating capacitor C2 is depicted as having additional parasitic couplings to the driving drain region 177a and the driving source region 176a of the driving semiconductor layer section 131a.

Herein, a current of the driving thin film transistor T1 may be modeled as satisfying the following Equation 1.

$$I = \frac{\beta}{2}\alpha(V_{gs} + fV_{ds} - V_{th})^2 \qquad \text{Equation 1}$$

Herein, I is the current of the driving thin film transistor T1, β is a constant, a is a value of $$\frac{C_1}{C_1 + C_2 + C_{para}},$$

f is a value of $$\frac{C_{para}}{C_1},$$

Cpara is the parasitic capacitance, Vgs is a voltage difference between the driving gate electrode and the driving source electrode, Vds is a voltage difference between the driving drain electrode and the driving source electrode, and Vth is the threshold voltage.

In the driving thin film transistor T1, because the floating gate electrode 25 is interposed between the driving semiconductor layer section 131a and the driving gate electrode 125a, an electric field dissipation interval between the driving gate electrode (DG) 125a and the driving semiconductor layer section 131a is broadened, and thus the driving range of the gate voltages that may be safely applied to the driving gate electrode (DG) 125a without danger of breakdown may be broadened. However, current scattering of the driving thin film transistor T1 may occur due to capacitance value scattering of the first floating capacitor C1 and of the second floating capacitor C2.

The fVds value in Equation 1 largely affects the current scattering of the driving thin film transistor T1, and an occurrence of the current scattering of the driving thin film transistor T1 may be reduced by setting the fVds value to 0 or a value that is close to 0. In other words, if C1 can be made substantially larger than Cpara, the ratio of Cpara/C1 is driven towards zero.

In this case, one of the factors that may be used to set the fVds value at or close to 0 is that of constituting the second gate insulating layer 142 as a high-K dielectric material having permittivity of 10 to 100. As those skilled in the art will appreciate, the capacitance value of the first floating capacitor C1 is a function of dielectric constant (permittivity), plate area and dielectric thickness. Thus, the use of a high-K and relatively thin dielectric layer 142 helps to set the f value close to 0 and helps to avoid mass production deviation (scattering) of the current passed through the driving thin film transistor T1 as modeled by equation 1.

Figure 7:
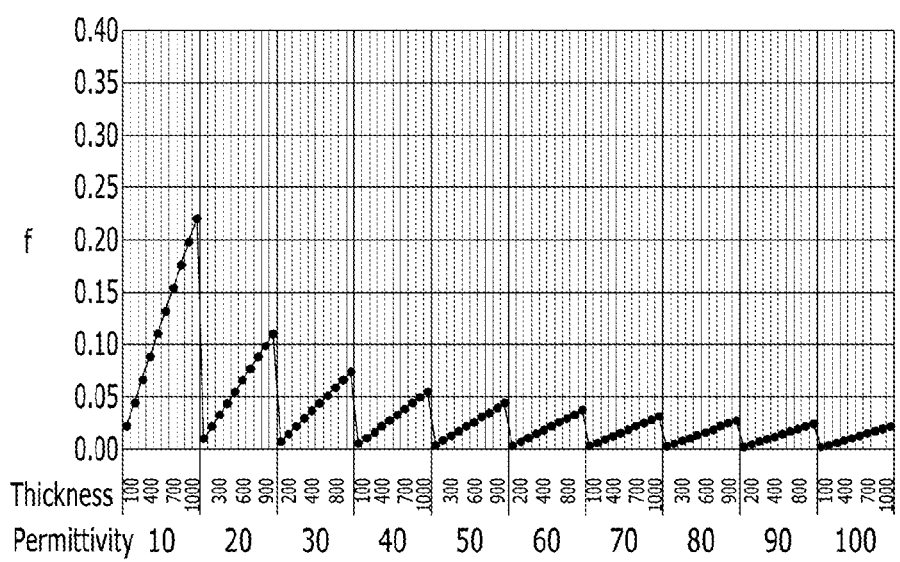
FIG. 7 is a graph illustrating an f value according to permittivity and a thickness of the second gate insulating layer of the organic light emitting diode display according to the exemplary embodiment of the present invention.

FIG. 7 is a graph illustrating variation in the f value (Y axis) as a function of both of permittivity and thickness of the second gate insulating layer 142 when employed in an organic light emitting diodes display such as that of the exemplary embodiment of the present disclosure.

Referring to FIG. 7, when permittivity of the second gate insulating layer was 10 and the thickness thereof was 1000 Å, the f value was about 0.225, when permittivity was 100 and the thickness was 1000 Å, the f value was about 0.025. Herein, the first gate insulating layer is formed of silicon dioxide (SiO2) and the thickness thereof is 2000 Å.

In a comparative other device in which a high-K dielectric was not used, the first gate insulating layer had the thickness of 2000 Å and was formed of silicon dioxide, and the second gate insulating layer had the thickness of 1000 Å, was formed of stoichiometric silicon nitride (Si3N4, dielectric constant of about 7.5), and it was found to have a non-zero f value of about 0.34. On the other hand, in all the embodiments in accordance with the present teachings where the dielectric constant (permittivity) was 10 or greater, the f value was less than 0.25 and when the dielectric constant (permittivity) was increased to 30 or higher, the f value was less than 0.10 as can be seen in plot points of FIG. 7.

In other words, when comparing the f value according to the present exemplary embodiment and a f value of the above mentioned comparative other device, when the second gate insulating layer 142 had permittivity of 10 and the thickness of 1000 Å, the f value was reduced by about 34%, and when the second gate insulating layer had permittivity of 100 and the thickness of 1000 Å, the f value was reduced by about 93%. That means that scattering (mass production deviation) of the current value was significantly reduced.

As described above, the fVds value in Equation 1 may be set to a value that is closed to 0 by forming the second gate insulating layer to have permittivity of 10 to 1000, accordingly, have the thickness of 100 Å to 1000 Å, thus setting the f value to a value that is close to 0. Therefore, the occurrence of the current scattering of the driving thin film transistor T1 may be greatly reduced.

While the present disclosure of invention has been described in connection with what is presently considered to be practical exemplary embodiments, it is to be understood that the present teachings are not limited to the disclosed embodiments, but, on the contrary, are intended to cover various modifications and equivalent arrangements included within the spirit and scope of the teachings.

What is claimed is:
1. An organic light emitting diodes display comprising:
a substrate;
a scan line disposed on the substrate and configured for transferring a scan signal;

a data line and a driving voltage line each extending to cross with the scan line and respectively configured for transferring a data signal and a driving voltage;

a switching thin film transistor connected to the scan line and the data line;

a driving thin film transistor connected to the switching thin film transistor and the driving voltage line; and an organic light emitting diode connected to and having it drive current controllable by the driving thin film transistor, wherein the driving thin film transistor includes:
- a driving semiconductor layer section including a driving channel region, and a driving source region and a driving drain region disposed on both lateral surfaces of the driving channel region,
- a first gate insulating layer covering the driving semiconductor layer section,
- a floating gate electrode disposed on the first gate insulating layer and disposed at a position corresponding to the driving channel region,
- a second gate insulating layer covering the floating gate electrode, and
- a driving gate electrode disposed on the second gate insulating layer and at a position corresponding to the floating gate electrode, wherein the second gate insulating layer has a permittivity in the range of about 10 to about 100.

2. The organic light emitting diodes display of claim 1, wherein
a thickness of the second gate insulating layer is 100 Å to 1000 Å.

3. The organic light emitting diodes display of claim 2, wherein
the second gate insulating layer has a single-layered structure formed of any one of zirconium oxide, zirconium oxide doped with metal, hafnium oxide, hafnium oxide doped with metal, titanium oxide, titanium oxide doped with metal, aluminum oxide, and aluminum oxide doped with metal.

4. The organic light emitting diodes display of claim 2, wherein
the second gate insulating layer has a multilayered structure, and
each layer is formed of any one of zirconium oxide, zirconium oxide doped with metal, hafnium oxide, hafnium oxide doped with metal, titanium oxide, titanium oxide doped with metal, aluminum oxide, and aluminum oxide doped with metal.

5. The organic light emitting diodes display of claim 2, wherein
the second gate insulating layer has a multilayered structure including a layer formed of any one of zirconium oxide, zirconium oxide doped with metal, hafnium oxide, hafnium oxide doped with metal, titanium oxide, titanium oxide doped with metal, aluminum oxide, and aluminum oxide doped with metal, and a layer formed of a silicon oxide layer or a silicon nitride layer.

6. The organic light emitting diodes display of claim 1, wherein the switching thin film transistor includes:
- a switching semiconductor layer section including a switching channel region, and a switching source region and a switching drain region disposed on both lateral surfaces of the switching channel region, and
- a switching gate electrode disposed on the first gate insulating layer covering the switching semiconductor layer section and disposed at a position corresponding to the switching channel region.

7. The organic light emitting diodes display of claim 6, wherein
impurity doping concentrations of the switching source region, the switching drain region, the driving source region, and the driving drain region are substantially the same as each other.

8. The organic light emitting diodes display of claim 7, wherein
the floating gate electrode is disposed in a same layer as that of the switching gate electrode and the scan line.

9. The organic light emitting diodes display of claim 8, wherein
the switching gate electrode is connected to the scan line, and the floating gate electrode is separated from the scan line.

10. The organic light emitting diodes display of claim 9, wherein the second gate insulating layer covers the switching gate electrode.

11. The organic light emitting diodes display of claim 1, further comprising a storage capacitor connected to the driving thin film transistor and the driving voltage line.

12. The organic light emitting diodes display of claim 11, further comprising:
- a first light emitting control thin film transistor and a second light emitting control thin film transistor connected to the driving thin film transistor, and
- a light emitting control line configured for transferring a light emitting control signal to the first light emitting control thin film transistor and the second light emitting control thin film transistor,
wherein the driving thin film transistor is connected to the driving voltage line and the organic light emitting diode through the first light emitting control thin film transistor and the second light emitting control thin film transistor.

13. The organic light emitting diode display of claim 12, further comprising a compensation thin film transistor connected to the scan line and the driving thin film transistor.

14. The organic light emitting diode display of claim 13, further comprising:
- an initialization thin film transistor connected to the compensation thin film transistor,
- a prior scan signal line connected to the initialization thin film transistor and configured for transferring a prior scan signal, and
- an initialization voltage line connected to the initialization thin film transistor and configured for transferring an initialization voltage.

15. The organic light emitting diode display of claim 14, further comprising a boosting capacitor connected to the scan line and the driving thin film transistor.

* * * * *